US011319883B2

(12) United States Patent
Vesely et al.

(10) Patent No.: US 11,319,883 B2
(45) Date of Patent: May 3, 2022

(54) AUXILIARY POWER UNIT POWER COMPRESSOR HEALTH STATE DIAGNOSTIC SYSTEM AND METHOD

(71) Applicant: HONEYWELL INTERNATIONAL INC., Morris Plains, NJ (US)

(72) Inventors: Lukas Vesely, Prague (CZ); Lukas Palaj, Brno (CZ); Jan Neuzil, Brno (CZ); Radek Hedl, okres Blansko (CZ)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 276 days.

(21) Appl. No.: 16/280,217

(22) Filed: Feb. 20, 2019

(65) Prior Publication Data

US 2020/0263560 A1    Aug. 20, 2020

(51) Int. Cl.
| | | |
|---|---|---|
| *F02C 9/18* | (2006.01) | |
| *B64D 45/00* | (2006.01) | |
| *F01D 17/16* | (2006.01) | |
| *F02C 6/08* | (2006.01) | |
| *B64D 13/06* | (2006.01) | |

(52) U.S. Cl.
CPC .............. *F02C 9/18* (2013.01); *B64D 45/00* (2013.01); *F01D 17/16* (2013.01); *F02C 6/08* (2013.01); *B64D 2013/0611* (2013.01); *B64D 2013/0618* (2013.01); *B64D 2045/0085* (2013.01); *F05D 2260/80* (2013.01)

(58) Field of Classification Search
CPC ............ F01D 17/16; B64D 2013/0611; B64D 2013/0618
See application file for complete search history.

(56) References Cited

U.S. PATENT DOCUMENTS

| | | | |
|---|---|---|---|
| 9,437,054 B2 | 9/2016 | Catt | |
| 2003/0187554 A1 | 10/2003 | Henry et al. | |
| 2013/0013222 A1 | 1/2013 | Gu et al. | |
| 2015/0096359 A1* | 4/2015 | Catt | ........................ F01D 17/02 73/112.01 |
| 2016/0244179 A1 | 8/2016 | Catt | |

OTHER PUBLICATIONS

Gorinevsky, Dimitry, et al., "Model-Based Diagnostics for An Aircraft Auxiliary Power Unit, "Proceedings of the 2002 IEEE International Conference on Control Applications, Sep. 18-20, 2002.

* cited by examiner

*Primary Examiner* — Katheryn A Malatek
(74) *Attorney, Agent, or Firm* — Lorenz & Kopf, LLP

(57) ABSTRACT

A system and method for diagnosing load compressor health state for an auxiliary power unit that includes a power compressor, a combustor, a power turbine, and a load compressor is provided. The auxiliary power unit is operated and bleed air is discharged from the load compressor at a bleed air pressure. Using a pressure sensor, the bleed air pressure discharged from the load compressor is sensed and supplied to a processor. In the processor, power compressor health state is diagnosed based solely on the sensed bleed air pressure.

9 Claims, 3 Drawing Sheets

AUXILIARY POWER UNIT POWER COMPRESSOR HEALTH STATE DIAGNOSTIC SYSTEM AND METHOD

The project leading to this application has received funding from the Clean Sky 2 Joint Undertaking under the European Union's Horizon 2020 research and innovation programme under grant agreement No 686782.

TECHNICAL FIELD

The present invention generally relates to auxiliary power units, and more particularly relates to a system and method for diagnosing the health state of an auxiliary power unit power compressor.

BACKGROUND

In many aircraft, main propulsion engines not only provide propulsion for the aircraft, but may also be used to drive various other rotating components such as, for example, generators, compressors, and pumps, to thereby supply electrical, pneumatic and/or hydraulic power. However, when an aircraft is on the ground, its main engines may not be operating. Moreover, in some instances the main propulsion engines may not be capable of supplying the power needed for propulsion as well as the power to drive these other rotating components. Thus, many aircraft include an auxiliary power unit (APU) to supplement the main propulsion engines in providing electrical, pneumatic, and/or hydraulic power. An APU may also be used to start the propulsion engines.

An APU is typically a gas turbine engine that includes a combustion section, a power turbine section, and a compressor section. During operation of the APU, the compressor section draws in and compresses ambient air and supplies the air to the combustion section and to various pneumatic loads. Fuel is injected into the compressed air within the combustion section to produce the high-energy combusted air to the power turbine section. The power turbine section rotates to drive a generator for supplying electrical power, via a main shaft, and to drive one or more compressors (e.g., a power compressor and a load compressor) in the compressor section.

Although the APU is not essential for commercial flight, its functions are sufficiently important that being able ability to diagnose its health status is relatively important. One of the goals associated with APU design is to keep the APU as simple and as lightweight as possible, while maintaining high functional reliability. As a result, the number of sensors mounted on the APU to monitor APU functions is limited, which limits the ability to accurately diagnose APU component health. The importance of APU diagnostics is confirmed by analyzing APU maintenance statistics. This analysis reveals that APU maintenance, including its accessories, represents approximately 9% of total aircraft component maintenance. Unfortunately, there is presently no means to distinguish between power turbine and engine compressor deterioration. This inability to distinguish between turbine deterioration and engine compressor deterioration prevents maintenance facilities from being able to tailor repair processes.

Hence, there is a need for a system and method to diagnosing the health state of an APU power compressor, without having to add additional sensors to the APU. The present invention addresses at least this need.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a power compressor health state diagnostic system includes an auxiliary power unit, a bleed air duct, a bleed air pressure sensor, and a processor. The auxiliary power unit includes a power compressor, a combustor, a power turbine, and a load compressor. The bleed air duct is coupled to the auxiliary power unit for receiving bleed air discharged from the load compressor. The bleed air pressure sensor is disposed in the bleed air duct and is configured to sense bleed air pressure and supply a bleed air pressure signal representative thereof. The processor is coupled to receive the bleed air pressure signal and is configured, upon receipt thereof, to diagnose power compressor health state based solely on the sensed bleed air pressure.

In another embodiment, a method for diagnosing load compressor health state for an auxiliary power unit that includes a power compressor, a combustor, a power turbine, and a load compressor, includes operating the auxiliary power unit, and discharging bleed air from the load compressor at a bleed air pressure. Using a pressure sensor, the bleed air pressure discharged from the load compressor is sensed and supplied to a processor. In the processor, power compressor health state is diagnosed based solely on the sensed bleed air pressure.

Furthermore, other desirable features and characteristics of the adaptive cooldown cycle system and method will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
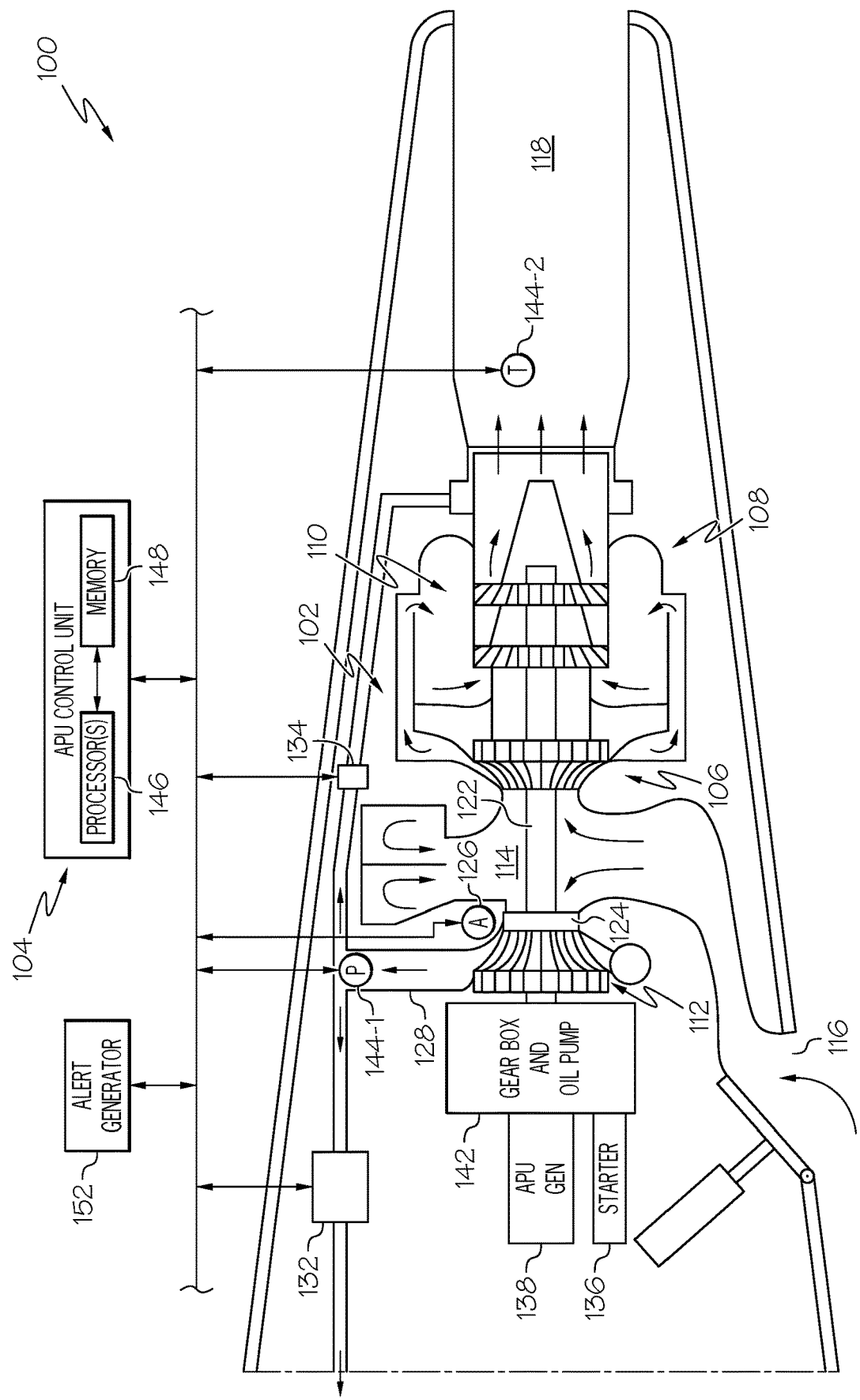
FIG. 1 depicts a schematic block diagram of one embodiment of an auxiliary power unit (APU) system.

Referring first to FIG. 1, one embodiment of an auxiliary power unit (APU) system 100 is depicted. The depicted APU system 100 includes an APU 102 and an APU control unit 104. The depicted APU 102 includes a power compressor 106, a combustor 108, a turbine 110, and a load compressor 112. During operation, the power compressor 106 draws ambient air into an inlet plenum 114 via an inlet 116. The power compressor 106 compresses the air and supplies the compressed air to the combustor 108. It will be appreciated that the power compressor 106 may be implemented using any one of numerous types of compressors. For example, the power compressor 106 may be a single-stage or multi-stage centrifugal and/or axial compressor system.

The combustor 108 receives the compressed air from the power compressor 106, and also receives a flow of fuel from a non-illustrated fuel source. The fuel and compressed air are mixed within the combustor 108, and the fuel-air mixture is ignited to produce relatively high-energy combustion gas. The combustor 108 may be implemented as any one of numerous types of combustors, including can-type combustors, reverse-flow combustors, through-flow combustors, and slinger combustors.

The relatively high-energy combustion gas that is generated in the combustor 108 is supplied to the turbine 110. As the high-energy combustion gas expands through the turbine 110, it impinges on the turbine blades, which causes the turbine 110 to rotate. The gas is then exhausted from the turbine into an exhaust duct 118. It will be appreciated that the turbine 110 may be implemented using any one of numerous types of turbines. The turbine 110 includes a shaft 122 that drives the power compressor 106 and the load compressor 112.

The load compressor 112, when driven, draws ambient air into the plenum 114 via the inlet 116 and compresses the air. In the depicted embodiment, a plurality of inlet guide vanes (IGVs) 124 (schematically shown) are disposed adjacent to or at the inlet of the load compressor 112. The IGVs 124 are movable, via one or more inlet guide vane actuators 126 (schematically shown), to a plurality of positions. The inlet guide vane actuators 126, and thus the positions of the inlet guide vanes 124, are controlled via inlet guide vane control logic or schedules disposed within the APU control unit 104. As with the power compressor 106, the load compressor 112 may be implemented using any one of numerous types of compressors, including a single-stage or multi-stage centrifugal and/or axial compressor system. Though not depicted in FIG. 1, it will be appreciated that the load compressor 112 may also include a diffuser and/or air collection scroll that receives and distributes the compressed air.

The compressed air from the load compressor 112 may be supplied to various non-illustrated pneumatic loads. Thus, as FIG. 1 also depicts, a bleed air duct 128 is coupled to receive compressed air from the load compressor 112 and supplies the compressed air, via a bleed valve 132, to the various pneumatic loads. The bleed valve 132 is responsive to bleed valve position commands to move between a fully-closed position and a plurality of open positions between the fully-closed and a fully-open position. The various pneumatic loads may include, for example, the aircraft environmental control system (ECS), the main engine turbine starter motor, and/or various other pneumatic aircraft functions.

As is generally known, the compressed air supplied by the load compressor 112 may exceed what is needed by the pneumatic loads. Thus, to prevent load compressor surge, the depicted APU system 100 additionally includes a surge control valve 134. The surge control valve 134 is in fluid communication with the bleed air duct 128. The surge control valve is responsive to surge valve position commands, supplied from the APU control unit 104, to move between a fully-closed position and a plurality of open positions between the fully-closed and a fully-open position. In particular, the APU control unit 104 commands the surge control valve 134 to modulate to a position that maintains adequate surge margin while maintaining the required flow and pressure to the pneumatic loads. The compressed air that flows through the surge control valve 134 is discharge into the exhaust duct 118.

The depicted APU 102 also includes a starter motor 136 and a generator 138, both of which are coupled to the shaft 122 via a gearbox and oil pump arrangement 142. The starter motor 136, when included, is used to rotate the shaft 122 when the APU 102 is being started. The generator 138, if included, may be used to generate and supply electrical power to various non-illustrated electrical loads. The gearbox and oil pump arrangement 142 help match the rotational speeds of the starter motor 136 and generator 138 to the APU 102, and supplies oil to various rotating components in the APU 102.

The APU system 100 additionally includes a plurality of sensors 144. Each sensor is configured to sense a parameter associated with the APU 102, and a supply sensor signal representative of the sensed parameter to the APU control unit 104. The number and type of sensors 144 included in the APU system 100 may vary. For example, the sensors 144 may include one or more speed sensors, one or more temperature sensors, and/or one or more pressure sensors, just to name a few. For purposes of this disclosure, only a bleed air pressure sensor 144-1 and an exhaust gas temperature (EGT) sensor 144-2 are depicted and further described. The bleed air pressure sensor 144-1 is disposed in the bleed air duct 118 and the EGT sensor 144-2 is disposed in the exhaust duct 118. The bleed air pressure sensor 144-1 is configured to sense bleed air pressure and supply a bleed air pressure signal representative thereof to the APU control unit 104. The EGT sensor 144-2 is configured to sense EGT and supply an EGT signal representative thereof to the APU control unit 104.

The APU control unit 104 is in operable communication with the APU 102 and and is configured to control the APU 102. In particular, the APU control unit 104 includes one or more processors 146 that, in response to operator commands and sensor signals supplied from one or more sensors 130, are configured to execute operational control logic and to diagnose the health state of various components within the APU 102. The operational control logic that is executed, including the control logic used to control the positions of the IGVs 124, the bleed valve 132, and the surge control valve 134, may be implemented using any one of numerous conventional operational control logics and will therefore not be further described.

The manner in which the APU control unit 104 uses the sensor signals to diagnose the health state of some of the components within the APU 102 is presently known. For example, the APU control unit 104 may fairly accurately determine the health state of the turbine 110 from the EGT temperature, and the health state of the load compressor 112 from bleed air pressure. These techniques are generally known and will, therefore, not be further described in detail. However, the APU control unit 104 disclosed herein is further configured to diagnose the health state of the power compressor 106. The manner in which power compressor health state is diagnosed is heretofore unknown and will thus be described in more detail.

Figure 2:
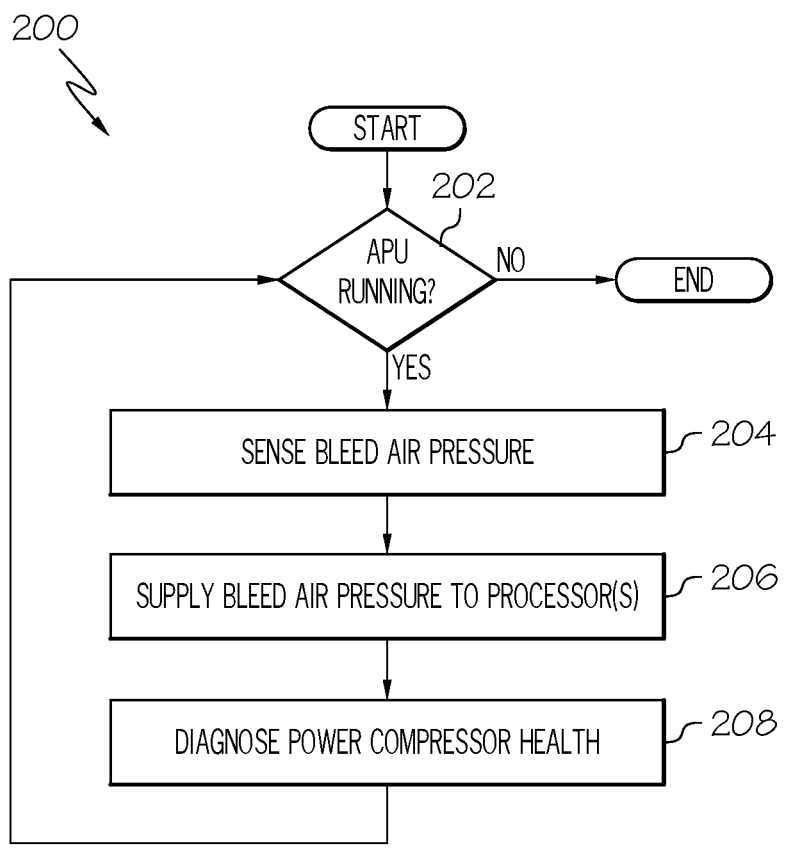
FIG. 2 depicts a flowchart of one embodiment of shutdown control logic that may be implemented in the APU control unit of FIG. 1 for controlling the APU during a shutdown/cooldown cycle.

Turning now to FIG. 2, the process implemented in the APU system 100 to diagnose the health state of the power compressor is depicted, in flowchart form, and will now be described. The process 200 begins when the APU 102 is started and begins operating (202). The bleed air pressure sensor 144-1 senses the pressure of the bleed air being discharged from the load compressor 112 (204) and supplies the sensed bleed air pressure to the one or more processors 146 in the APU control unit 104 (206). The one or more processors 146 then diagnose the health state of the power compressor 106 based solely on the sensed bleed air pressure (208).

It will be appreciated that the one or more processors 146 may diagnose the health state of the power compressor 106 using various techniques. In the depicted embodiment, however, the processors 146 track the sensed bleed air pressure over time, and diagnose the power compressor health state based on the tracked bleed air pressure. To facilitate this, and as FIG. 1 further depicts, the APU control unit 104 may additionally include memory 148. The memory is in operable communication with the one or more processors 146 and is configured to store bleed air pressure values that are supplied thereto from the one or more processors 146. The memory 148 may be implemented using any one of numerous types of memory. Moreover, although it is depicted in FIG. 1 as being implemented separate from the one rom or processors 146, the memory 148 may form an integral part of the one or more processors 146.

The one or more processors 146 in the APU control unit 104 may additionally be configured to generate and supply a notification signal when sensed bleed air pressure reduces to a predetermined pressure magnitude. For APU control units 104 that are configured with this capability, the system 100 may additionally include an alert generator 152. The alert generator 152, when included, is coupled to receive the notification signal and is configured, upon receipt thereof, to generate an alert. It will be appreciated that the alert that is generated may be an audible alert, a visual alert, or both.

Figure 3:
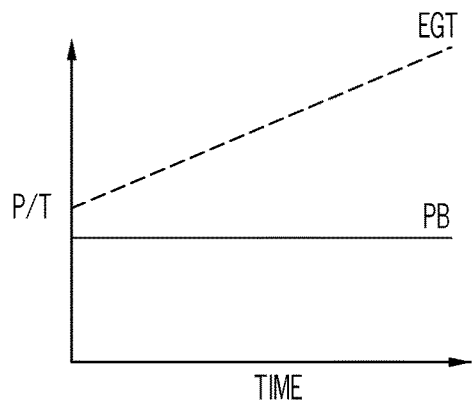
FIGS. 3-5 graphically depict example historical trends of exhaust gas temperature and bleed air pressure of an APU that may be used to diagnose health state.
Figure 4:
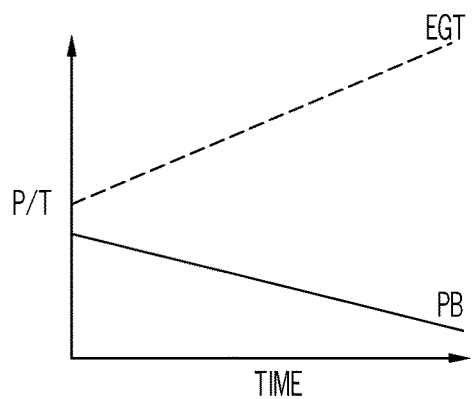
Figure 5:
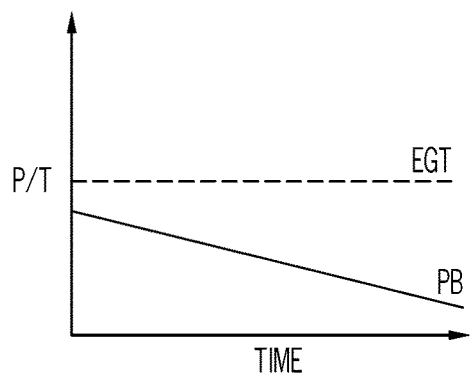

Turning now to FIGS. 3-5, graphic representations of APU parameter trends, and more specifically historical trends of exhaust gas temperature (EGT) and bleed air pressure (PB), of an APU 102 are depicted. In FIG. 3, exhaust gas temperature is increasing relatively significantly over time, whereas bleed air pressure is remaining relatively steady over the same time period. Based on this, the one or more processors 146 determine that the turbine 110 is degrading, while the power compressor 106 is exhibiting little (if any) degradation. In FIG. 4, exhaust gas temperature is increasing relatively significantly over time, and bleed air pressure is decreasing relatively significantly over the same time period. Based on this, the one or more processors 146 determine that both the turbine 110 and the power compressor 106 are degrading. In FIG. 5, exhaust gas temperature is decreasing relatively slowly over time, whereas bleed air pressure is decreasing relatively significantly over the same time period. Based on this, the one or more processors 146 determine that the turbine 110 is exhibiting little (if any) degradation, while the power compressor 106 is exhibiting significant degradation.

The system and method described herein provide a means for diagnosing the health state of an APU power compressor without having to add additional sensors to the APU.

In one embodiment, a power compressor health state diagnostic system includes an auxiliary power unit, a bleed air duct, a bleed air pressure sensor, and a processor. The auxiliary power unit includes a power compressor, a combustor, a power turbine, and a load compressor. The bleed air duct is coupled to the auxiliary power unit for receiving bleed air discharged from the load compressor. The bleed air pressure sensor is disposed in the bleed air duct and is configured to sense bleed air pressure and supply a bleed air pressure signal representative thereof. The processor is coupled to receive the bleed air pressure signal and is configured, upon receipt thereof, to diagnose power compressor health state based solely on the sensed bleed air pressure.

These aspects and other embodiments may include one or more of the following features. The processor may be further configured to track bleed air pressure over time and diagnose the power compressor health state based on the tracked bleed air pressure. A memory may be in operable communication with the processor and configured to store bleed air pressure values, and the processor may be further configured to supply bleed air pressure values to the memory for storage therein. A reduction in bleed air pressure over time may indicate degradation of the power compressor, and the processor may be further configured to supply a notification signal when the bleed air pressure reduces to a predetermined pressure magnitude. An alert generator may be coupled to receive the notification signal and may be configured, upon receipt thereof, to generate an alert. The alert may be one or more of an audible alert and a visual alert. An air inlet duct may be coupled to the auxiliary power unit and configured to supply air to the power compressor and the load compressor. A bleed air valve may be disposed on the bleed air duct and moveable between an open position, in which bleed air flows through the bleed air duct, and a closed position, in which bleed air does not flow through the bleed air duct. A plurality of inlet guide vanes may be disposed within the auxiliary power unit upstream of the load compressor. The inlet guide vanes may be moveable to a plurality of inlet guide vane positions to thereby control air flow into the load compressor. An inlet guide vane actuator may be coupled to the inlet guide vanes and configured to move the inlet guide vanes to the plurality of inlet guide vane positions. A surge control valve may be in fluid communication with the bleed air duct. The surge control valve may be responsive to valve position commands to move between a fully-closed position and a plurality of open positions between the fully-closed and a fully-open position. An exhaust gas temperature sensor may be coupled to the auxiliary power unit. The exhaust gas temperature sensor may be configured to sense the temperature of exhaust gas discharged from the power turbine and supply a temperature signal representative thereof. The processor may be coupled to receive the temperature signal and may be further configured, upon receipt thereof, to diagnose power turbine health state based on the sensed temperature.

In another embodiment, a method for diagnosing load compressor health state for an auxiliary power unit that includes a power compressor, a combustor, a power turbine, and a load compressor, includes operating the auxiliary power unit, and discharging bleed air from the load compressor at a bleed air pressure. Using a pressure sensor, the bleed air pressure discharged from the load compressor is sensed and supplied to a processor. In the processor, power compressor health state is diagnosed based solely on the sensed bleed air pressure.

These aspects and other embodiments may include one or more of the following features. Tracking, using the processor, bleed air pressure over time, and diagnosing, in the processor, the power compressor health state based on the tracked bleed air pressure. Supplying, using the processor, bleed air pressure values to a memory for storage therein. Supplying, with the processor, a notification signal when the bleed air pressure reduces to a predetermined pressure magnitude. Supplying the notification signal to an alert generator and generating an alert using the alert generator. The alert may be one or more of an audible alert and a visual alert.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "computer-readable medium", "processor-readable medium", or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

Some of the functional units described in this specification have been referred to as "modules" in order to more particularly emphasize their implementation independence. For example, functionality referred to herein as a module may be implemented wholly, or partially, as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like. Modules may also be implemented in software for execution by various types of processors. An identified module of executable code may, for instance, comprise one or more physical or logical modules of computer instructions that may, for instance, be organized as an object, procedure, or function. Nevertheless, the executables of an identified module need not be physically located together but may comprise disparate instructions stored in different locations that, when joined logically together, comprise the module and achieve the stated purpose for the module. Indeed, a module of executable code may be a single instruction, or many instructions, and may even be distributed over several different code segments, among different programs, and across several memory devices. Similarly, operational data may be embodied in any suitable form and organized within any suitable type of data structure. The operational data may be collected as a single data set, or may be distributed over different locations including over different storage devices, and may exist, at least partially, merely as electronic signals on a system or network.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A power compressor health state diagnostic system, comprising:
    an auxiliary power unit comprising a power compressor, a combustor, a power turbine, and a load compressor;
    a bleed air duct coupled to the auxiliary power unit for receiving bleed air discharged from the load compressor;
    a bleed air pressure sensor disposed in the bleed air duct and configured to sense bleed air pressure and supply a bleed air pressure signal representative thereof;
    memory configured to store bleed air pressure values; and
    a processor coupled to receive the bleed air pressure signal and configured, upon receipt thereof, to:
        supply the bleed air pressure values to the memory for storage therein,
        track the bleed air pressure values over time, whereby power compressor degradation is determined based solely on the tracked bleed air pressure values over time, wherein a reduction in bleed air pressure over time is used to indicate the degradation of the power compressor, and
        supply a notification signal when the bleed air pressure reduces to a predetermined pressure magnitude.

2. The system of claim 1, further comprising:
    an alert generator coupled to receive the notification signal and configured, upon receipt thereof, to generate an alert.

3. The system of claim 2, wherein the alert is one or more of an audible alert and a visual alert.

4. The system of claim 1, further comprising:
    an air inlet duct coupled to the auxiliary power unit and configured to supply air to the power compressor and the load compressor.

5. The system of claim 1, further comprising a bleed air valve disposed on the bleed air duct and moveable between an open position, in which bleed air flows through the bleed air duct, and a closed position, in which bleed air does not flow through the bleed air duct.

6. The system of claim 1, further comprising:
    a plurality of inlet guide vanes disposed within the auxiliary power unit upstream of the load compressor, the inlet guide vanes moveable to a plurality of inlet guide vane positions to thereby control air flow into the load compressor.

7. The system of claim 6, further comprising:
    an inlet guide vane actuator coupled to the inlet guide vanes and configured to move the inlet guide vanes to the plurality of inlet guide vane positions.

8. The system of claim 1, further comprising:
    a surge control valve in fluid communication with the bleed air duct, the surge control valve responsive to valve position commands to move between a fully-closed position and a plurality of open positions between the fully-closed and a fully-open position.

9. The system of claim 1, further comprising:
    an exhaust gas temperature sensor coupled to the auxiliary power unit, the exhaust gas temperature sensor configured to sense the temperature of exhaust gas discharged from the power turbine and supply a temperature signal representative thereof to the processor.

* * * * *